United States Patent [19]

Shishikura

[11] Patent Number: 6,121,820
[45] Date of Patent: *Sep. 19, 2000

[54] SEMICONDUCTOR DEVICE HAVING FUSE AND METHOD FOR CHECKING WHETHER THE FUSE IS FUSED

[75] Inventor: Nobuo Shishikura, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/910,003

[22] Filed: Aug. 12, 1997

[30] Foreign Application Priority Data

Aug. 14, 1996 [JP] Japan ..................... 8-214745

[51] Int. Cl.[7] .................................................. H01H 37/76
[52] U.S. Cl. ......................... 327/525; 365/96; 365/225.7
[58] Field of Search ................................. 327/525, 526; 365/96, 225.7; 324/550; 340/638

[56] References Cited

U.S. PATENT DOCUMENTS

| 5,426,616 | 6/1995 | Kajigaya et al. .................. 365/226 |
| 5,442,589 | 8/1995 | Kowalski ........................ 365/225.7 |
| 5,731,760 | 3/1998 | Ramirez .......................... 327/525 |

*Primary Examiner*—Terry D. Cunningham
*Assistant Examiner*—An T. Luu
*Attorney, Agent, or Firm*—Finnegan, Henderson, Farabow, Garrett & Dunner, L.L.P.

[57] ABSTRACT

A semiconductor device having a fuse has a fuse and a resistance connected in series between power-supply potential and ground and decides whether the fuse is fused in accordance with the potential of the connection point between the fuse and the resistance connected in series between the power-supply potential and the ground under the normal operating state. A decision circuit is included whose input terminal is connected to the connection point between the fuse and the resistance to decide whether the fuse is fused. A switching circuit is included which connects a test resistance in parallel with the fuse at the time of a test but does not connect the test resistance under the normal state and at the time of the test, a fuse resistance value in a range wider than the range for deciding whether a fuse is fused under the normal state is decided to be defective to decide whether the fuse is fused.

18 Claims, 5 Drawing Sheets

| FUSED STATE | EXPECTED | NOT FUSED | FUSED | |
|---|---|---|---|---|
| | ACTUAL | NORMAL | NORMAL | UNFUSED |
| NORMAL MODE | EXPECTED VALUE | "0" | "1" | |
| | DECISION | "0" | "1" | UNSTABLE |
| TEST MODE | EXPECTED VALUE | "0" | "1" | |
| | DECISION | "0" | "1" | "0" |
F I G. 5
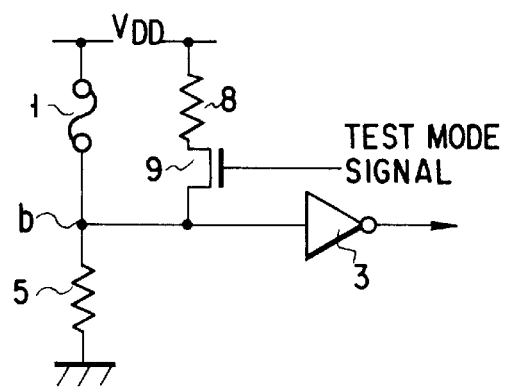
F I G. 6
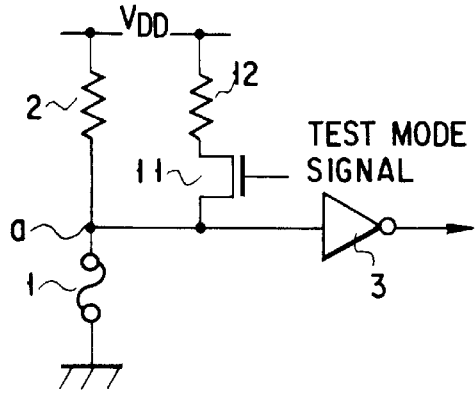
F I G. 7

| FUSED STATE | EXPECTED | NOT FUSED | | FUSED |
|---|---|---|---|---|
| | ACTUAL | NORMAL | ERRONEOUS FUSION | NORMAL |
| NORMAL MODE | EXPECTED VALUE | "0" | | "1" |
| | DECISION | "0" | UNSTABLE | "1" |
| TEST MODE | EXPECTED VALUE | "0" | | "1" |
| | DECISION | "0" | "1" | "1" |
F I G. 9
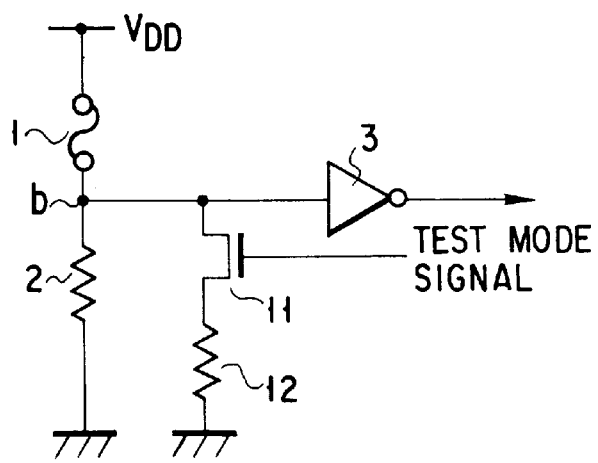
F I G. 10

6,121,820

SEMICONDUCTOR DEVICE HAVING FUSE AND METHOD FOR CHECKING WHETHER THE FUSE IS FUSED

BACKGROUND OF THE INVENTION

The present invention relates to a semiconductor device having, for example, a redundancy circuit using a fuse to be fused by a laser beam or the like and a method for checking whether the fuse is fused at the time of a shipping test.

In the case of a conventional semiconductor device having a redundancy circuit using a fuse to be fused by a laser beam or the like, it is necessary to check whether the fuse is fused before shipping the device.

In this case, a fuse circuit has a structure in which a pull-up resistance is connected with the fuse in series or a pull-down resistance is connected with the fuse in parallel.

The potential at the connection point between the fuse and the pull-up resistance or between the fuse and the pull-down resistance is determined in accordance with resistance division between the resistance of the fuse and the pull-up resistance or between the resistance of the fuse and the pull-down resistance.

Therefore, because the resistance of a fuse increases when the fuse is fused or it decreases when the fuse is not fused, it is possible to check whether the fuse is fused in accordance with the potential of the connection point of the fuse.

FIG. 1 shows a conventional fuse circuit in which a fuse 1 is connected to a pull-up resistance 2. The first terminal of the fuse 1 is grounded and the second terminal of it is connected to the first terminal of the pull-up resistance 2. The second terminal of the pull-up resistance 2 is connected to a power supply VDD.

The connection point a between the fuse 1 and the pull-up resistance 2 is connected to, for example, an input terminal of an inverter 3. In general, the resistance value of the pull-up resistance 2 is set to a value larger than that of the fuse 1 not fused.

The potential of the connection point a between the fuse 1 and the pull-up resistance 2 is greatly fluctuated depending on whether the fuse 1 is fused. Therefore, it is possible to check whether the fuse 1 is fused in accordance with a signal output from the inverter 3 by using the relation between the potential of the connection point a and the threshold of the inverter 3.

That is, because the resistance value of the fuse 1 is smaller than that of the pull-up resistance 2 when the fuse 1 is not fused, the potential of the connection point a has a value close to the ground. Therefore, the inverter 3 decides that an input signal is "0".

Moreover, because the resistance value of the fuse 1 shows a high impedance when the fuse 1 is fused, the potential of the connection point a has a value close to the power-supply potential. Therefore, the inverter 3 decides that an input signal is "1".

FIG. 2 shows a conventional fuse circuit in which the fuse 1 is connected to a pull-down resistance 5. The first terminal of the pull-down resistance 5 is grounded and the second terminal of it is connected to the first terminal of the fuse 1. The second terminal of the fuse 1 is connected to the power supply VDD.

The connection point b between the fuse 1 and the pull-down resistance 5 is connected to, for example, an input terminal of the inverter 3. In general, the resistance value of the pull-down resistance 5 is set to a value larger than that of the fuse 1 not fused.

In the case of the circuit shown in FIG. 2, the potential of the connection point b between the fuse 1 and the pull-down resistance 5 is greatly fluctuated depending on whether the fuse 1 is fused. It is decided whether the fuse 1 is fused in accordance with a signal output from the inverter 3 by using the relation between the potential of the connection point b and the threshold of the inverter 3.

That is, because the resistance value of the fuse 1 is smaller than that of the pull-down resistance 5 when the fuse 1 is not fused, the potential of the connection point b has a value close to the power-supply potential VDD. Therefore, the inverter 3 decides that an input signal is "1".

Moreover, because the resistance of the fuse 1 shows a high impedance when the fuse 1 is fused, the potential of the connection point b has a value close to the ground. Therefore, the inverter 3 decides that an input signal is "0".

When fusing the fuse 1 by a laser beam or the like, no problem occurs as long as the fuse 1 is completely fused. However, when the fuse 1 is not completely fused, the decision on whether the fuse 1 is fused becomes unstable and a problem occurs.

When the potential determined in accordance with the resistance division between the fuse 1 and the pull-up resistance 2 is kept in a range of a potential at which it is decided that the fuse 1 is fused even if the fuse 1 to be fused is not completely fused and moreover, even if a potential determined in accordance with the resistance division when the fuse 1 is completely fused, a semiconductor device having the fuse 1 is shipped as a non-defective product with the fuse 1 fused.

However, because the potential of the connection point between the fuse 1 and the pull-up resistance 2 or the threshold of the inverter 3 fluctuates due to operating conditions such as voltage, temperature, and noise desired by a user or a change of device characteristics with the passage of time, the above product shipped to the user as a non-defective product may be erroneously decided as a defective product in which the fuse is not fused.

However, if the fuse 1 which must not be fused is erroneously fused due to any reason, the product having the fuse 1 is removed as a defective product because it is decided that the fuse 1 is erroneously fused at the time of a shipping test when the fuse 1 is completely fused.

However, when the fuse 1 is incompletely fused and the potential determined in accordance with the resistance division between the fuse 1 and the pull-up resistance 2 is kept at a boundary between potentials by which it is decided that the fuse 1 is not fused, it is decided that the fuse 1 is not fused and the product having the fuse 1 is shipped.

After shipping the product, however, it may be decided as a product in which the fuse 1 is fused, that is, a defective product when the user uses the product due to the operating conditions such as the voltage, temperature, and noise desired by the user or a change of device characteristics with the passage of time.

Thus, the fact that a product is decided as a defective one after shipping the product to a user results in the fact that the maker loses their credit.

A case is described above in which the pull-up resistance 2 in FIG. 1 is used. However, also when using the pull-down resistance 5 in FIG. 2, the same problem occurs.

BRIEF SUMMARY OF THE INVENTION

The present invention is made to solve the above problems and its object is to provide a semiconductor device having a fuse and a method for checking whether the fuse of the semiconductor device is fused, making it possible to securely exclude a product having a fuse which must be fused but which is incompletely fused or a fuse which must not be fused but which is erroneously fused before shipping the product.

To achieve the above object, a semiconductor device of the present invention having a fuse comprises a fuse and a resistance connected between the power-supply potential and the ground in series, a decision circuit whose input terminal is connected to the connection point between the fuse and the resistance to decide whether the fuse is fused, a test resistance, and a switching circuit connecting the test resistance in parallel with the fuse at the time of a test but not normally connecting the test resistance.

Moreover, a semiconductor device of the present invention having a fuse comprises a fuse and a resistance connected between the power-supply potential and the ground in series, a decision circuit whose input terminal is connected to the connection point between the fuse and the resistance to decide whether the fuse is fused, a test resistance, and a switching circuit connecting the test resistance in parallel with the resistance at the time of a test but not normally connecting the test resistance.

A method of the present invention for checking whether the fuse of a semiconductor device is fused is a fuse checking method comprising the steps of connecting a fuse and a resistance between the power-supply potential and the ground in series and deciding whether the fuse is fused in accordance with the potential of the connection point between the fuse and the resistance, in which, when deciding whether the fuse is fused at the time of a test, a new fuse resistance value obtained by connecting a test resistance in parallel with the fuse is decided to be defective as a fuse resistance value having a range larger than the range when deciding whether a fuse is fused under normal use.

By using the above structure, a semiconductor device of the present invention using a fuse and a method of the present invention for checking whether the fuse of the semiconductor device is fused make it possible to decide a fuse which must be fused but which is incompletely fused as a fuse which is not fused and exclude the fuse as a defective product by connecting a resistance in parallel with the fuse and decreasing the parallel resistance value at the time of a shipping test.

Moreover, it is possible to decide a fuse which must not be fused but which is incompletely fused as a fuse which is fused and exclude the fuse as a defective product by connecting a resistance in parallel with a pull-up resistance or pull-down resistance at the time of a shipping test.

Thus, it is possible to decide only products having no problem on the operating conditions of a user as non-defective products at the time of a shipping test and ship them.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is an illustration showing a conventional fuse circuit in, for example, a redundancy circuit using a fuse to be fused by a laser beam or the like;

FIG. 5 is an illustration showing decision results when deciding whether the fuse in the fuse circuit in FIG. 3 is fused;

FIG. 6 is an illustration showing the second embodiment of the fuse circuit of a semiconductor device of the present invention having a fuse;

FIG. 7 is an illustration showing the third embodiment of the fuse circuit of a semiconductor device of the present invention having a fuse;

FIG. 9 is an illustration showing decision results when deciding whether the fuse in the fuse circuit in FIG. 7 is fused; and FIG. 10 is an illustration showing the fourth embodiment of the fuse circuit of a semiconductor device of the present invention having a fuse.

DETAILED DESCRIPTION OF THE INVENTION

The preferred embodiments of a semiconductor device of the present invention having a fuse are described below by referring to the accompanying drawings.

Figure 1:
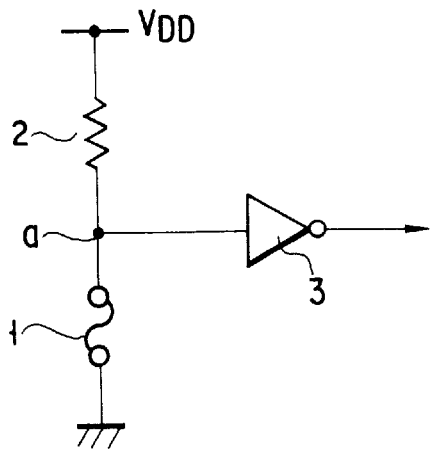
Figure 2:
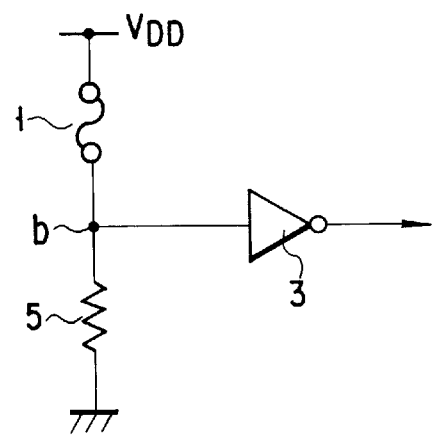
FIG. 2 is an illustration showing another conventional fuse circuit in, for example, a redundancy circuit using a fuse to be fused by a laser beam.
Figure 3:
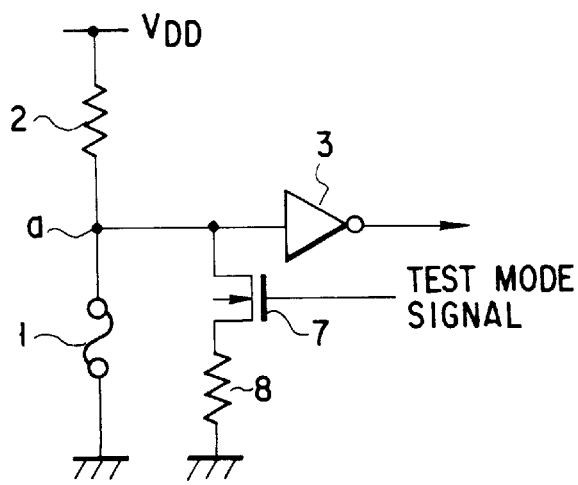
FIG. 3 is an illustration showing the first embodiment of the fuse circuit of a semiconductor device of the present invention having a fuse.

FIG. 3 is an illustration showing the first embodiment of the fuse circuit of a semiconductor device of the present invention having a fuse.

The first embodiment makes it possible to securely exclude the fuse 1 to be fused as a defective product when the fuse 1 is not completely fused due to any reason and thereby, decision on whether the fuse 1 is fused becomes unstable.

In FIG. 3, the first terminal of the fuse 1 is grounded and the second terminal of it is connected to the first terminal of the pull-up resistance 2. The second terminal of the pull-up resistance 2 is connected to the power supply VDD.

The connection point a between the fuse 1 and the pull-up resistance 2 is connected to, for example, the input terminal of the inverter 3. The resistance value of the pull-up resistance 2 is set to a value larger than that of the fuse 1 which is not fused.

The fuse 1 is made of, for example, polysilicon and fused by, for example, a laser beam. Moreover, the connection point a between the fuse 1 and the pull-up resistance 2 is connected to the drain of an n-channel transistor 7.

The source of the transistor 7 is connected to the first terminal of a test resistance 8 and the second terminal of the test resistance 8 is grounded. A test mode signal is supplied to the gate of the transistor 7.

In the above fuse circuit, the potential of the connection point a between the fuse 1 and the pull-up resistance 2 is greatly fluctuated depending on whether the fuse 1 is fused. Therefore, by using the relation between the potential of the connection point a and the threshold of the inverter 3, it is decided whether the fuse 1 is fused in accordance with a signal output from the inverter 3.

That is, because the resistance value of the fuse 1 is smaller than that of the pull-up resistance 2 when the fuse 1 is not fused, the potential of the connection point a has a value close to the ground. Therefore, the inverter 3 decides that an input signal is "0".

Moreover, because the resistance value of the fuse 1 shows a high impedance when the fuse 1 is fused, the potential of the connection point a has a value close to the power-supply potential. Therefore, the inverter 3 can decide that an input signal is "1".

Then, operations of the fuse circuit which is the first embodiment are described below by referring to FIG. 4.

To simplify the description, the resistance value of the pull-up resistance 2 is set to a value two times larger than the resistance of the fuse 1 not fused and the resistance value of the test resistance 8 is set to a value two times larger than that of the pull-up resistance 2. That is, the ratio between the resistance of the fuse 1, that of the pull-up resistance 2, and that of the test resistance 8 is set to 1:2:4. Moreover, the threshold of the inverter 3 for deciding the potential of the connection point a is set to ½×VDD.

Figure 4:
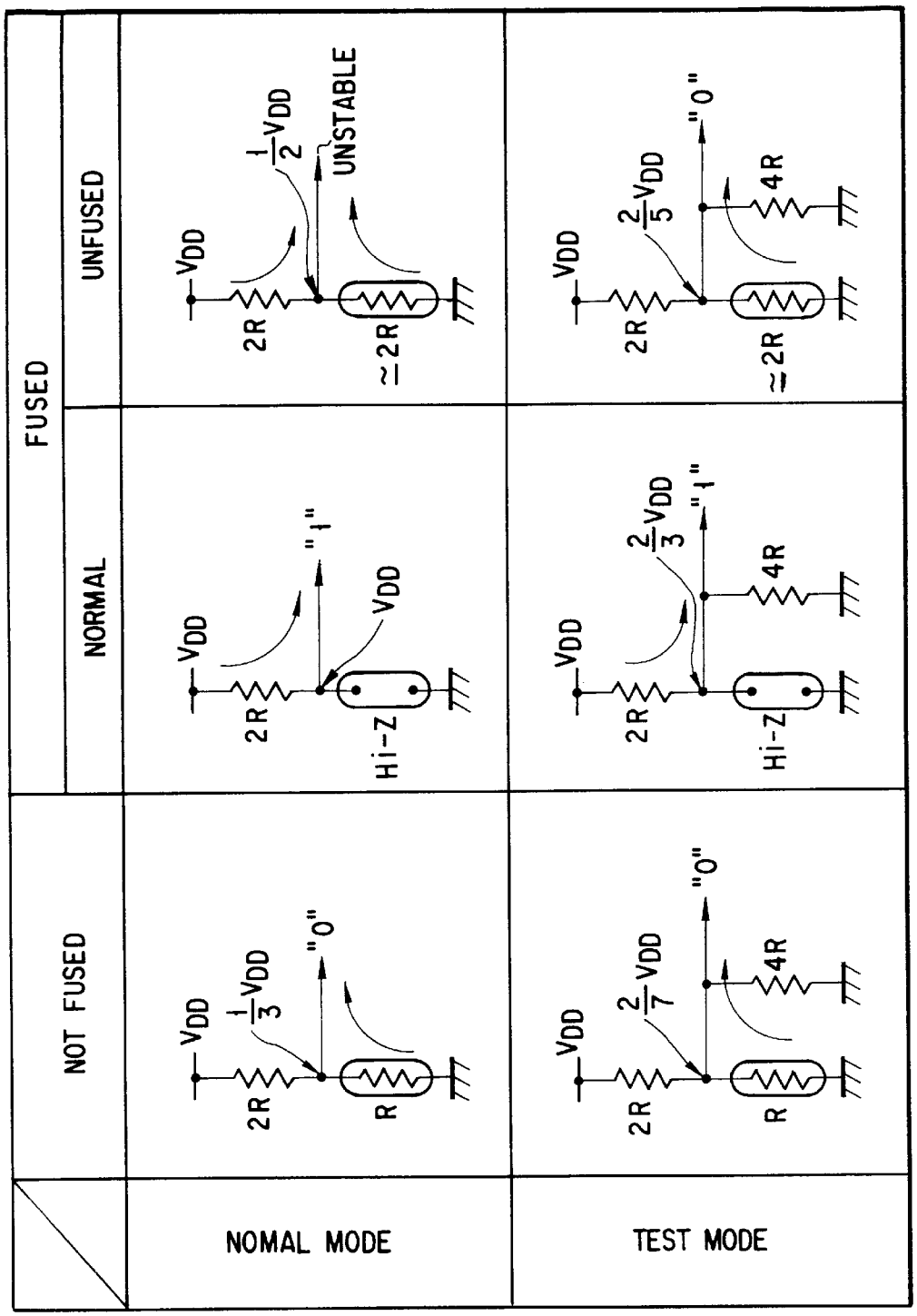
FIG. 4 is an illustration for explaining operation states of the first embodiment of the fuse circuit shown in FIG. 3.

FIG. 4 shows the relation between fused sate of a fuse and state of a circuit in the normal mode and the test mode respectively. Moreover, FIG. 5 shows the relation between fused state of a fuse and decision on whether the fuse is fused in the normal mode and the test mode respectively.

In the case of the circuit shown in FIG. 3, a test mode signal is set to "0" in the normal operation state except a shipping test. Thereby, the transistor 7 is turned off and the test resistance 8 is disconnected from the fuse circuit.

At the time of the shipping test, the test mode signal is set to "1", the transistor 7 is turned on, and the test resistance 8 is connected with the fuse circuit.

Therefore, as shown in FIG. 4, in the normal mode, the input potential of the inverter 3 shows ⅓×VDD when the fuse is not fused at all and VDD when the fuse is completely fused.

Moreover, in the test mode, the input potential of the inverter 3 shows 2/7×VDD when the fuse 1 is not fused at all or the test resistance 8 is connected as a resistance value 4R. When the fuse 1 is completely fused, the potential shows ⅔×VDD.

Therefore, as shown in FIG. 5, when the fuse 1 is not completely fused, the inverter 3 decides "0" or "not fused" on the fuse not fused both in the normal and test modes.

When the fuse is normally fused, the inverter 3 decides "1" or "fused" on the fused fuse. Thus, expected decision results are obtained.

Then, a case is assumed in which a fuse is not completely fused as the result of fusing the fuse and the resistance value of the fuse 1 after fused becomes 2R which is equal to the resistance of the pull-up resistance 2.

In this case, the input potential of the inverter 3 shows ½×VDD in the normal mode as shown in FIG. 4 and the threshold of the inverter 3 shows ½×VDD as described above. Therefore, the decision on whether the fuse is fused becomes unstable. Thus, the fuse is decided to be fused through a shipping test and a product having the fuse may be shipped as a non-defective product.

In the test mode, the test resistance 8 (resistance value of 4R) is connected with the fuse 1 (resistance value of 2R) in parallel and the input potential of the inverter 3 shows ⅖×VDD. Therefore, the inverter 3 decides that the input potential is "0". That is, because the inverter 3 decides "0" for the expected value "1" when the fuse is completely fused, the semiconductor device having the fuse is excluded as a defective product having an unfused fuse.

Thus, when the fuse 1 to be fused is incompletely fused, the fuse 1 is decided as a defective product having an unfused fuse in the normal mode when the resistance of the fuse 1 is 2R or less. In the test mode, however, the fuse the fuse 1 is decided as a defective product when the resistance of the fuse 1 after fused is 4R or less by connecting the test resistance 8.

Therefore, it is possible to decrease the probability in which it is erroneously decided that the fuse 1 is not fused when a user uses a product having the fuse 1 in the normal mode.

"That is, because a product having the fuse 1 is decided as a defective product when the resistance of the fuse 1 is 4R or less rather than 2R or less, the product is decided as a non-defective product when the fuse 1 is greatly fused, that is, the fuse 1 has only a small unfused portion. Therefore, it is possible to prevent a product still having a margin to be turned on from being shipped as a non-defective product."

FIG. 6 is an illustration showing the second embodiment of the fuse circuit of a semiconductor device of the present invention having a fuse.

Similarly to the first embodiment, the second embodiment makes it possible to securely exclude the fuse 1 as a defective product through a shipping test when the decision on whether the fuse 1 is fused is unstable because the fuse 1 to be fused is not completely fused due to any reason.

The first terminal of the fuse 1 is connected to the power-supply potential VDD and the second terminal of the fuse 1 is connected to the first terminal of the pull-down resistance 5. The second terminal of the pull-down resistance 5 is grounded. The connection point b between the fuse 1 and the pull-down resistance 5 is connected to the input terminal of the inverter 3. Moreover, the first terminal of the test resistance 8 is connected to the power-supply potential VDD and a transistor 9 is set between the second terminal of the test resistance 8 and the connection point b. A test mode signal is supplied to the gate of the transistor 9.

By turning on the transistor 9 at the time of a shipping test and connecting the test resistance 8 in parallel with the fuse 1, it is possible to securely decide the fuse 1 on which unstable decision is made because it is incompletely fused when the test resistance 8 is not added as a defective product.

For example, the ratio between resistance values of the fuse 1, pull-down resistance 5, and test resistance 8 is shown as 1:2:4. Moreover, the threshold of the inverter 3 for deciding the potential of the connection point b is ½×VDD.

FIG. 7 is an illustration showing the third embodiment of the fuse circuit of a semiconductor device of the present invention having a fuse.

The third embodiment makes it possible to securely exclude a product having the fuse 1 as a defective product when the fuse 1 which must not be fused is incompletely fused due to any reason and thereby, the decision on whether the fuse 1 is fused becomes unstable.

The first terminal of the fuse 1 is grounded and the second terminal of it is connected to the first terminal of the pull-up resistance 2. The second terminal of the pull-up resistance 2 is connected to the power-supply potential VDD. The connection point a between the fuse 1 and the pull-up resistance 2 is connected to the input terminal of the inverter 3. Moreover, the first terminal of a test resistance 12 is connected to the power-supply potential VDD and a transistor 11 is set between the second terminal of the test resistance 12 on one hand and the connection point a between the pull-up resistance 2 and the fuse 1 on the other.

A test mode signal is supplied to the gate of the transistor 11. The transistor 11 is turned on at the time of a test to connect the test resistance 12 between the connection point a and the power-supply potential VDD in parallel with the pull-up resistance 2.

To simplify the description, the resistance value of the pull-up resistance 2 is set to a value two times larger than that of the fuse 1 not fused and the resistance of the test resistance 12 is set to a value two times larger than that of the pull-up resistance 2. That is, the ratio between the resistance values of the fuse 1, pull-up resistance 2, and test resistance 12 is shown as 1:2:4. Moreover, the threshold of the inverter 3 for deciding the potential of the connection point a is set to ½×VDD.

Figure 8:
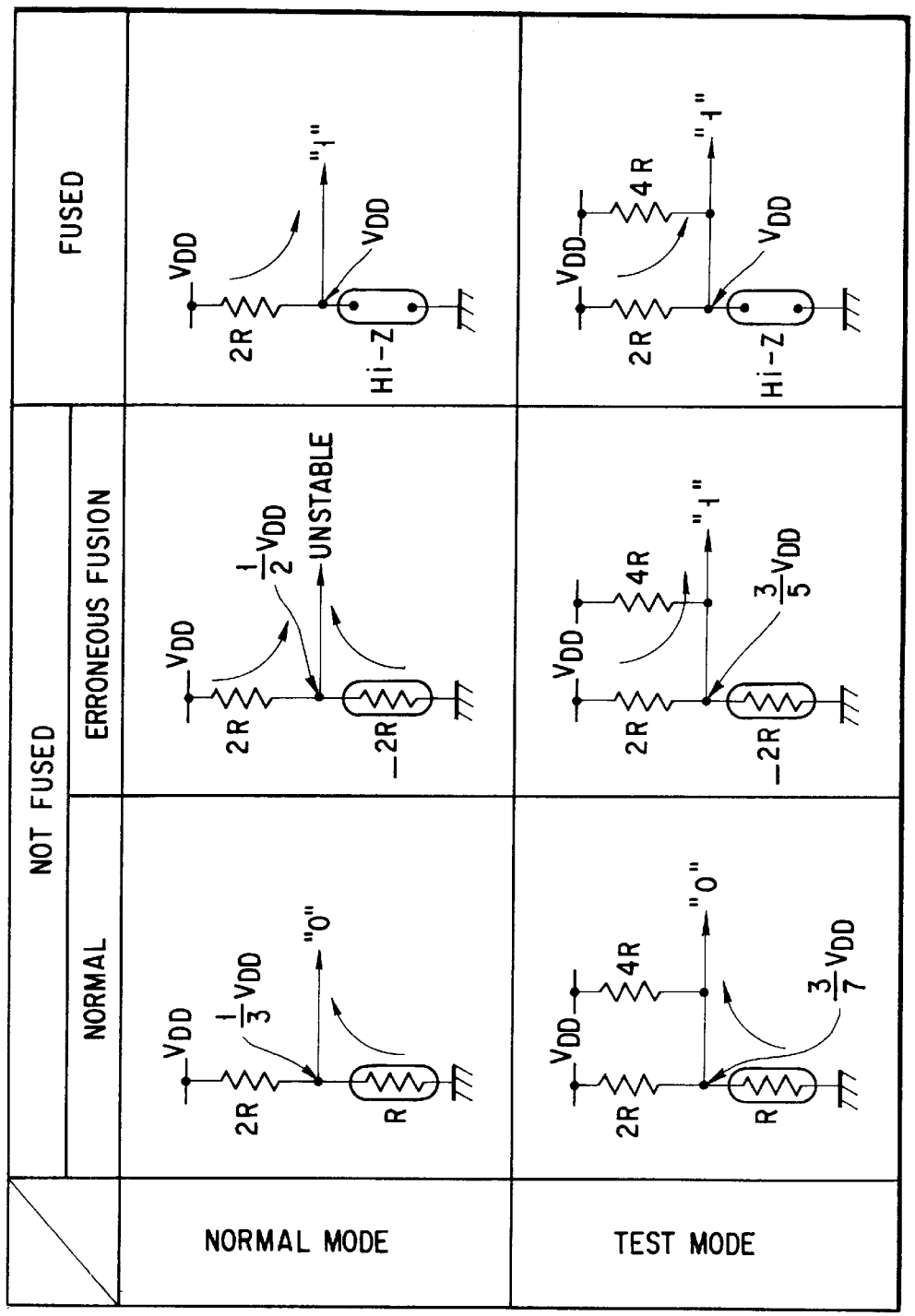
FIG. 8 is an illustration for explaining operation states of the third embodiment of the fuse circuit shown in FIG. 7.

FIG. 8 shows the fused state of a fuse and the state of a circuit in the normal mode and the test mode respectively.

In the case of the fuse circuit shown in FIG. 7, the transistor 11 is turned off by switching test mode signals in the normal operation state except a shipping test to disconnect the test resistance 12 from the fuse circuit. At the time of the shipping test, however, the transistor 11 is turned on to connect the test resistance 12 with the fuse circuit.

As shown in FIG. 8, the input potential of the inverter 3 comes to ⅓×VDD when the fuse 1 is not fused but it comes to VDD when the fuse 1 is completely fused in the normal mode. Moreover, the input potential of the inverter 3 comes to ⅗×VDD when the fuse is not fused in the test mode. However, when the fuse is completely fused, the input potential comes to VDD.

Therefore, when the fuse 1 is not fused both in the normal and test modes, the inverter 3 decides "0" or "not fused" on the fuse 1 not fused.

When the fuse 1 is normally fused, the inverter 3 decides "1" or "fused" on the fused fuse 1. Thus, expected decision results are obtained.

However, a case is assumed in which the fuse 1 which must not be fused is incompletely fused due to any reason and the resistance value of the fuse 1 after fused comes to 2R which is equal to the resistance value of the pull-up resistance 2.

In this case, because the input potential of the inverter 3 is ½×VDD in the normal mode as shown in FIG. 8 and the threshold of the inverter 3 is ½×VDD as described above, the decision on whether the fuse is fused becomes unstable. Therefore, it is decided that the fuse is fused in a shipping test and may be shipped as a non-defective product.

In the test mode, however, because the test resistance 12 is connected in parallel with the pull-up resistance 2, the input potential of the inverter 3 comes to ⅗×VDD.

Therefore, the inverter 3 decides that an input signal is set to "1". That is, a semiconductor device having the fuse 1 is excluded as a defective product because the decision result is "1" though the expected value is "0" because of the fuse 1 which must not be fused.

Thus, when a fuse which must not be fused is erroneously incompletely fused, the fuse is decided as a defective product when the resistance of the fuse after fused is 2R or more in the normal mode. In the test mode, however, the fuse is decided as a defective product when the resistance of the fuse after fused is ⅘×R or more.

Therefore, it is not erroneously decided that the fuse is fused when a user uses a product having the fuse in the normal mode.

FIG. 9 shows the relation between the fused state of a fuse and the result of deciding whether the fuse is fused in the above-described normal mode and test mode respectively.

FIG. 10 is an illustration showing the fourth embodiment of the fuse circuit of a semiconductor device of the present invention having a fuse.

This embodiment uses a circuit in which the power-supply potential VDD and the ground of the embodiment shown in FIG. 7 are reversed.

The first terminal of the test resistance 12 is grounded and the transistor 11 is set between the second terminal of the test resistance 12 on one hand and the connection point b between the fuse 1 and the pull-down resistance 2 on the other.

A test mode signal is supplied to the gate of the transistor 11.

This embodiment makes it possible to securely exclude the fuse 1 which must not be fused as a defective product through a shipping test when the fuse 1 is incompletely fused due to any reason and thereby, the decision on whether the fuse 1 is fused becomes unstable.

In the case of any of the above-described embodiments, a test resistance is connected by using a transistor. However, it is possible to use not only a transistor but also a switching circuit having a function for connecting a test resistance at the time of a test but connecting no test resistance under the normal state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:

a fuse and a resistance connected in series between power-supply potential and ground;

a decision circuit whose input terminal is connected to the connection point between said fuse and resistance to decide whether said fuse is fused;

a test resistance: and a switching circuit which connects said test resistance in parallel with said fuse at the time of a test but does not connect said test resistance under the normal state.

2. The semiconductor device having a fuse according to claim 1, wherein said fuse is fused by a laser beam.

3. The semiconductor device having a fuse according to claim 1, wherein said switching circuit comprises a transistor.

4. A semiconductor device, comprising:

a fuse and a fixed resistance connected in series between power-supply potential and ground;

a decision circuit whose input terminal is connected to the connection point between said fuse and said fixed resistance to decide whether said fuse is fused;

a fixed test resistance; and a switching circuit which connects said fixed test resistance in parallel with said fixed resistance at the time of a test but does not connect said fixed test resistance under the normal state.

5. The semiconductor device having a fuse according to claim 4, wherein said fuse is fused by a laser beam.

6. The semiconductor device having a fuse according to claim 4, wherein said switching circuit comprises a transistor.

7. A method for checking whether a fuse is fused using a semiconductor device having said fuse and comprising said fuse and a resistance connected in series between power-supply potential and ground, a decision circuit whose input terminal is connected to the connection point between said fuse and resistance to decide whether said fuse is fused, a test resistance, and a switching circuit which connects said test resistance in parallel with said fuse at the time of a test but does not connect said test resistance under the normal state, the method comprising the steps of:

deciding whether said fuse is fused in accordance with the potential of the connection point between said fuse and resistance connected in series between power-supply potential and ground under the normal operating state; and deciding whether said fuse is fused by deciding a fuse resistance value in a range wider than the range for deciding whether said fuse is fused under said normal operating state to be defective.

8. The method for checking whether a fuse of a semiconductor device having the fuse is fused according to claim 7, wherein the step of not connecting said test resistance under the normal operating state but connecting said test resistance in parallel with said fuse at the time of said test when said fuse is a fuse to be fused is included.

9. A method for checking whether a fuse is fused using a semiconductor device having said fuse and comprising said fuse and a fixed resistance connected in series between power-supply potential and ground, a decision circuit whose input terminal is connected to the connection point between said fuse and said fixed resistance to decide whether said fuse is fused, a fixed test resistance, and a switching circuit which connects said fixed test resistance in parallel with said fixed resistance at the time of a test but does not connect said fixed test resistance under the normal state, the method comprising the steps of:

deciding whether said fuse is fused in accordance with the potential of the connection point between said fuse and fixed resistance connected in series between power-supply potential and ground under the normal operating state; and deciding whether said fuse is fused by deciding a fuse resistance value in a range wider than the range for deciding whether said fuse is fused under said normal operating state to be defective.

10. The method for checking whether a fuse of a semiconductor device having said fuse is fused according to claim 9, wherein the step of not connecting said fixed test resistance under the normal operating state but connecting said fixed test resistance in parallel with said fixed resistance at the time of said test when said fuse is a fuse which must not be fused is included.

11. A semiconductor device comprising:

means including a fuse and a resistance connected in series between power-supply potential and ground, for supplying outputs in accordance with two states, one in which said fuse is blown and another in which said fuse remains;

a detection circuit whose input terminal is connected to the connection point between said fuse and resistance to detect whether said fuse is blown; and input reference value level shift means for said detection circuit, for shifting an input reference value level in a normal mode of said detection circuit for determining a range of the outputs which is in accordance with the two states at a test mode for testing whether said fuse is blown, so as to make an allowance for the input reference value level detected at an input terminal of said detection circuit in a state in which said fuse is incompletely blown, thereby expanding a decision range of whether said fuse is blown.

12. A semiconductor device according to claim 11, wherein said input reference value level shift means for said detection circuit is a resistance connected between the input terminal of said detection circuit and ground, so as to lower said input reference value level, thereby preventing a misjudgment that said fuse which is incompletely blown is misjudged to be not blown, due to a remainder of said fuse.

13. A semiconductor device according to claim 11, wherein said input reference value level shift means for said detection circuit is a resistance connected between the input terminal of said detection circuit and said power-supply potential, so as to lower said input reference value level, thereby preventing a misjudgment that said fuse which is not blown is misjudged to be blown, due to an error that said fuse is incompletely blown.

14. A semiconductor device according to claim 11, wherein said fuse is blown by a laser beam.

15. A semiconductor device comprising:

means including a fixed resistor and a fuse connected in series between power-supply potential and ground in a manner in which one end of the fixed resistor is connected to the power supply potential and one end of the fuse is connected to the ground, for supplying outputs in accordance with two states, one in which said fuse is blown and another in which said fuse remains;

a detection circuit whose input terminal is connected to a connection point between the other end of the fixed resistor and the other end of the fuse to detect whether said fuse is blown; and a test circuit connected in parallel with said fuse in a test mode and disconnected in a normal mode, said test circuit including a switch and a fixed test resistor serially connected between said connection point and the ground so that a composite resistance value of said fixed test resistor and fuse in a state in which said fuse is incompletely blown in the test mode is smaller than a resistance value of said fuse which is incompletely blown, so as to make an allowance for the input reference value level detected at an input terminal of said detection circuit in the state in which said fuse is incompletely blown.

16. A semiconductor device comprising:

means including a fixed resistor and a fuse connected in series between power-supply potential and ground in a manner in which one end of the fixed resistor is connected to the power supply potential and one end of the fuse is connected to the ground, for supplying outputs in accordance with two states, one in which said fuse is blown and another in which said fuse remains;

a detection circuit whose input terminal is connected to a connection point between the other end of the fixed resistor and the other end of the fuse to detect whether said fuse is blown; and a test circuit connected in parallel with said fixed resistor in a test mode and disconnected in a normal mode, said test circuit including a switch and a fixed test resistor serially connected between said connection point and the power supply potential so that a composite resistance value of said fixed test resistor and fixed resistor in a state in which said fuse is incompletely blown in the test mode is smaller than a resistance value of said fixed resistor, so as to make an allowance for the input reference value level detected at an input terminal of said detection circuit in the state in which said fuse is incompletely blown.

17. A semiconductor device comprising:

means including a fixed resistor and a fuse connected in series between power-supply potential and ground in a manner in which one end of the fuse is connected to the power supply potential and one end of the fixed resistor is connected to the ground, for supplying outputs in accordance with two states, one in which said fuse is blown and another in which said fuse remains;

a detection circuit whose input terminal is connected to a connection point between the other end of the fuse and the other end of the fixed resistor to detect whether said fuse is blown; and a test circuit connected in parallel with said fuse in a test mode and disconnected in a normal mode, said test circuit including a switch and a fixed test resistor serially connected between said connection point and the power supply potential so that a composite resistance value of said fixed test resistor and fuse in a state in which said fuse is incompletely blown in the test mode is smaller than a resistance value of said fuse which is incompletely blown, so as to make an allowance for the input reference value level detected at an input terminal of said detection circuit in the state in which said fuse is incompletely blown.

18. A semiconductor device comprising:

means including a fixed resistor and a fuse connected in series between power-supply potential and ground in a manner in which one end of the fuse is connected to the power supply potential and one end of the fixed resistor is connected to the ground, for supplying outputs in accordance with two states, one in which said fuse is blown and another in which said fuse remains;

a detection circuit whose input terminal is connected to a connection point between the other end of the fixed resistor and the other end of the fuse to detect whether said fuse is blown; and a test circuit connected in parallel with said fixed resistor in a test mode and disconnected in a normal mode, said test circuit including a switch and a fixed test resistor serially connected between said connection point and the ground so that a composite resistance value of said fixed test resistor and fixed resistor in a state in which said fuse is incompletely blown in the test mode is smaller than a resistance value of said fixed resistor, so as to make an allowance for the input reference value level detected at an input terminal of said detection circuit in the state in which said fuse is incompletely blown.

* * * * *